United States Patent
Guo

(10) Patent No.: US 11,388,818 B2
(45) Date of Patent: Jul. 12, 2022

(54) CIRCUIT BOARD, METHOD OF MANUFACTURING BASE PLATE AND METHOD OF MANUFACTURING CIRCUIT BOARD

(71) Applicants: QING DING PRECISION ELECTRONICS (HUAIAN) CO.,LTD, Huai an (CN); Avary Holding (Shenzhen) Co., Limited., Shenzhen (CN)

(72) Inventor: Zhi Guo, Shenzhen (CN)

(73) Assignees: QING DING PRECISION ELECTRONICS (HUAIAN) CO., LTD, Huai an (CN); Avary Holding (Shenzhen) Co., Limited., Shenzhen (CN)

( * ) Notice: Subject to any disclaimer, the term of this patent is extended or adjusted under 35 U.S.C. 154(b) by 0 days.

(21) Appl. No.: 17/029,369

(22) Filed: Sep. 23, 2020

(65) Prior Publication Data
US 2022/0071006 A1    Mar. 3, 2022

(30) Foreign Application Priority Data
Aug. 31, 2020    (CN) .......................... 202010898641.9

(51) Int. Cl.
| H05K 1/11 | (2006.01) |
| H05K 3/40 | (2006.01) |
| H05K 1/09 | (2006.01) |
| H01R 12/71 | (2011.01) |

(52) U.S. Cl.
CPC ............. H05K 1/11 (2013.01); H01R 12/71 (2013.01); H05K 1/09 (2013.01); H05K 3/4038 (2013.01)

(58) Field of Classification Search
CPC ........................................................ H05K 1/11
USPC ......................................................... 174/255
See application file for complete search history.

(56) References Cited

U.S. PATENT DOCUMENTS

| 5,435,057 A * | 7/1995 | Bindra .................... H05K 3/368 |
| | | 174/255 |
| 2005/0029010 A1* | 2/2005 | Ahn ................... H01L 21/76877 |
| | | 174/255 |
| 2015/0027756 A1* | 1/2015 | Hsu ....................... H05K 1/0242 |
| | | 174/255 |

FOREIGN PATENT DOCUMENTS

| TW | 201201633 A1 | 1/2012 |
| TW | 201720259 A | 6/2017 |
| TW | I608777 B * | 12/2017 |

* cited by examiner

*Primary Examiner* — Stanley Tso
(74) *Attorney, Agent, or Firm* — ScienBiziP, P.C.

(57) ABSTRACT

A method of manufacturing a base plate includes the following steps: providing a first substrate, the first substrate including a first base layer, a first copper coating and a second copper coating covered on two sides of the first base layer; opening at least one first hole on the first substrate, the first hole penetrating the first base layer and the first copper; forming a first electroplated coating on the first copper coating, the first copper coating filling the first hole to form a first connecting portion; opening at least one second hole on the first connecting portion and the first electroplated coating to form a plurality of second connecting pins.

18 Claims, 12 Drawing Sheets

CIRCUIT BOARD, METHOD OF MANUFACTURING BASE PLATE AND METHOD OF MANUFACTURING CIRCUIT BOARD

FIELD

The subject matter herein generally relates to a circuit technology, especially relates to a circuit board and a method of manufacturing a base plate and a method of manufacturing the circuit board.

BACKGROUND

In circuit board, Aspect Ratio (AR) of a blind hole is the radio of depth to aperture of the blind hole. With the development of the circuit board, pins number of input or output terminals of the circuit board are increased more and more. Thus, an interval between the blind holes of the circuit board is becoming smaller, and a high AR of the blind hole is further increased. However, in the prior art, manufacturing method of high AR of the circuit board is a difficult process, and the circuit having high AR may have a low reliability.

BRIEF DESCRIPTION OF THE DRAWINGS

Implementations of the present technology will now be described, by way of example only, with reference to the attached figures, wherein.

DETAILED DESCRIPTION

Figure 1:
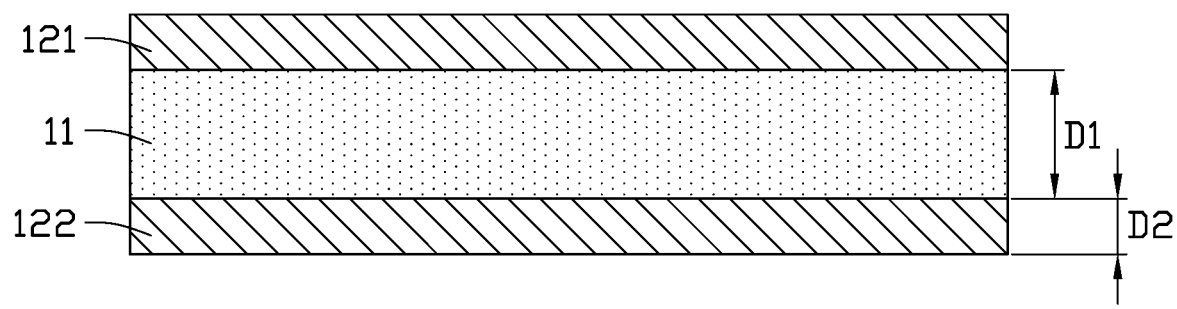
FIG. 1 is an isometric view of a substrate covered with copper . . . .

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

The present disclosure is described in relation to a method of manufacturing a base plate. The method of manufacturing the base plate including following steps:

S1: referring to FIG. 1, providing a first substrate 10. The first substrate 10 includes a first base layer 11, a first copper coating 121 and a second copper coating 122 covered on two sides of the first base layer 11.

In this embodiment, materials of the first base layer 11 include at least one polypropylene (PP), polyimide (PI), Benzocyclobutene (BCB), liquid crystal polymer (LCP), Polytetrafluoroethylene (PTEE) etc.

In this embodiment, a thickness of the first base layer 11 is marked as D1, D1=8~250 μm. A thickness of the first copy coating 121 and a thickness of the second copper coating 122 are equivalent and marked as D2, D2=5~250 μm.

Figure 2:
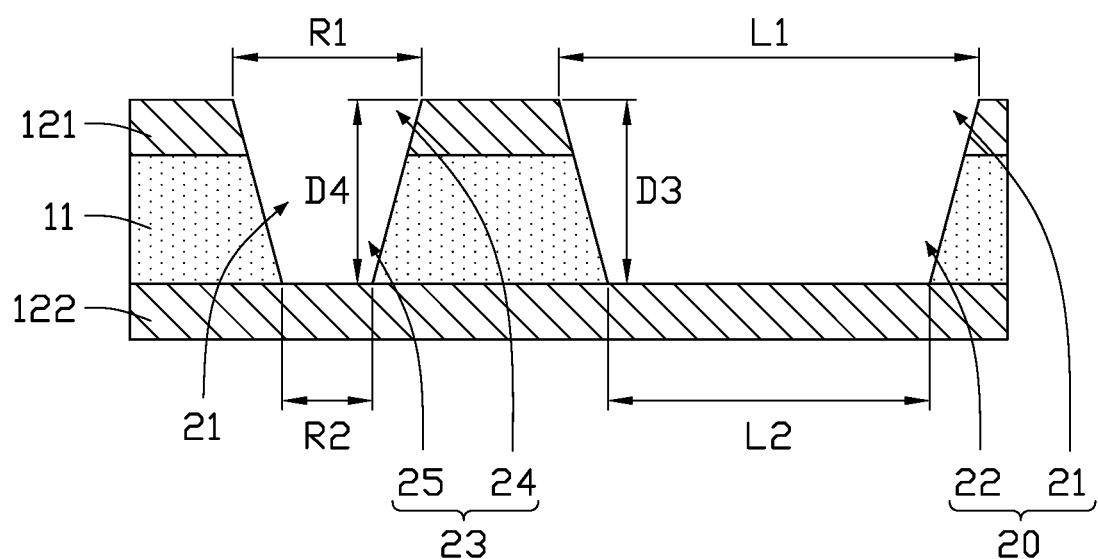
FIG. 2 is an isometric view of opening a first groove on the substrate of FIG. 1.

S2: referring to FIG. 2, opening at least one first hole 20 on the first substrate 10. The first hole 20 is throughout of the first base layer 11 and the first copper coating 121. The second copper coating 122 is exposed from the first hole 20.

In this embodiment, opening the first hole 20 is by laser or machine drilling. A cross-section of the first hole 20 along the first direction P is trapezoidal. The first hole 20 has a first end 21 and a second end 22 relatively to the first end 21. A length of the first end 21 on the cross-section of the first hole 20 is marked as L1, a length of the second end 22 on the cross-section of the first hole 20 is marked as L2, L1>L2.

Figure 3:
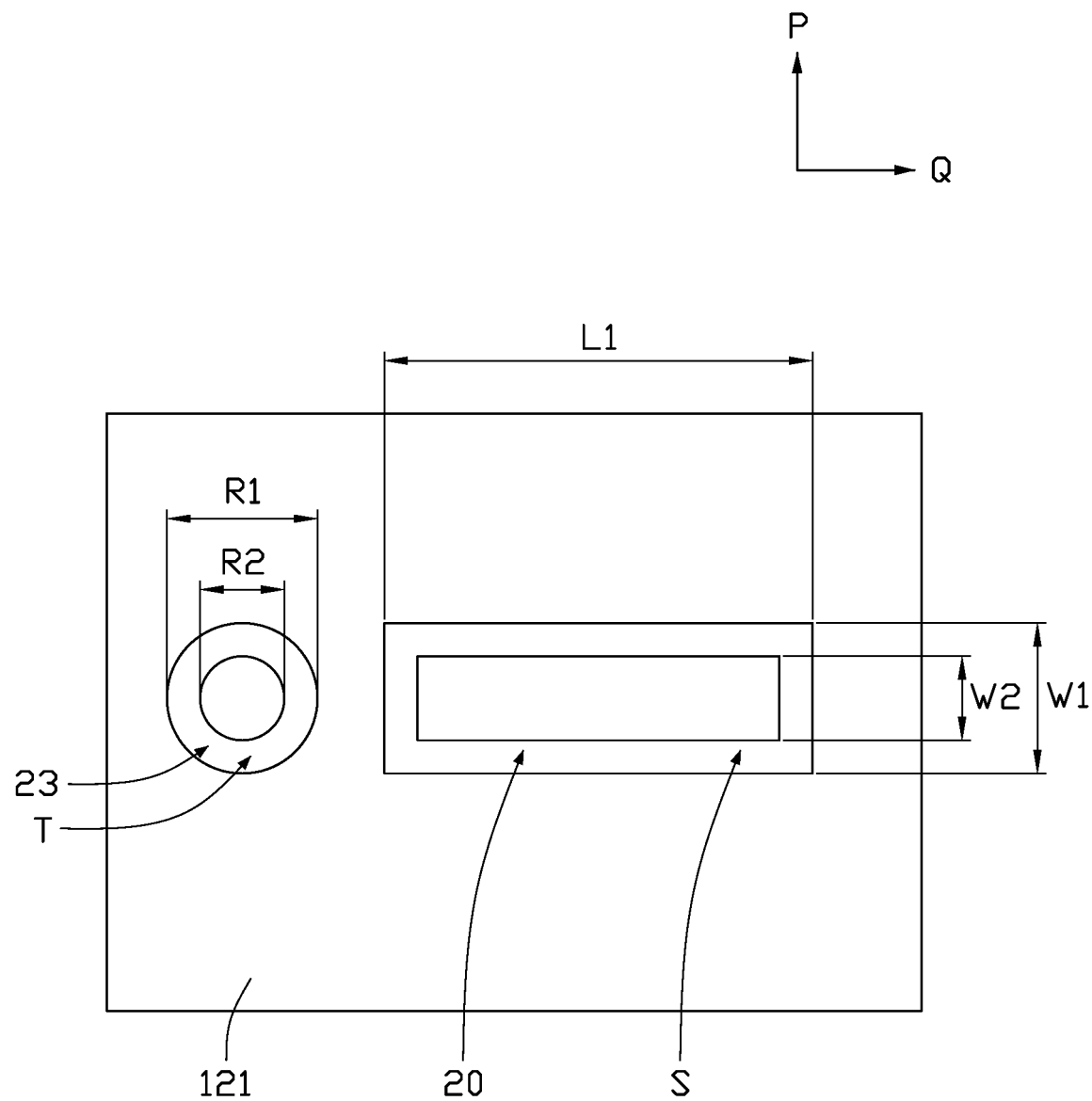
FIG. 3 is top view of FIG. 2.

Further referring to FIG. 3, a projection marked as S of the first end 21 on the first substrate 10 is a rectangle. A width of the projection of the first end is W1, W1=15~275 μm. Further, L1-L2>50 μm.

Figure 4:
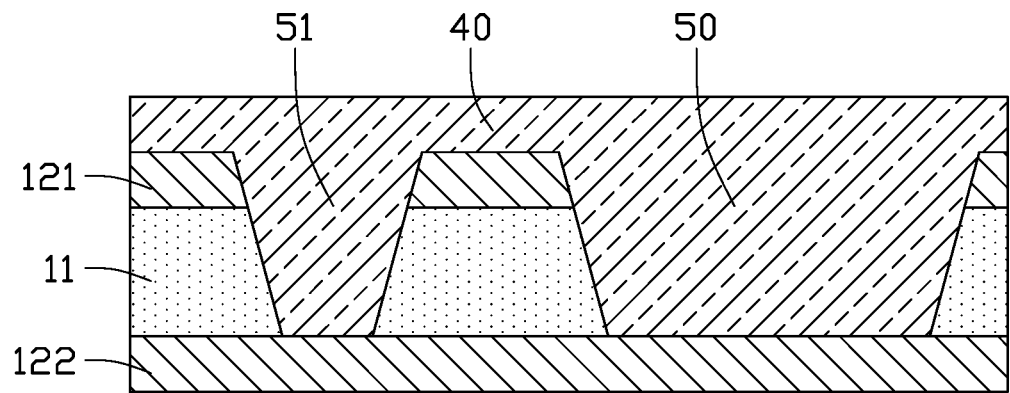
FIG. 4 is an isometric view of forming a first electroplated coating and a first connecting portion on the substrate of FIG. 2.

S3: referring to FIG. 4, forming a first electroplated coating 40 on the first copper coating 121. The first electroplated coating is further filled into the first hole 20 to form a first connecting portion 50.

In this embodiment, before forming the first electroplated coating 40, an auxiliary metal coating (not shown on the FIGS) is formed on the side of the first hole 20 to connect between the first copper coating 121 and the second copper coating 122. The first connecting portion 50 is formed on the auxiliary metal coating.

Figure 5:
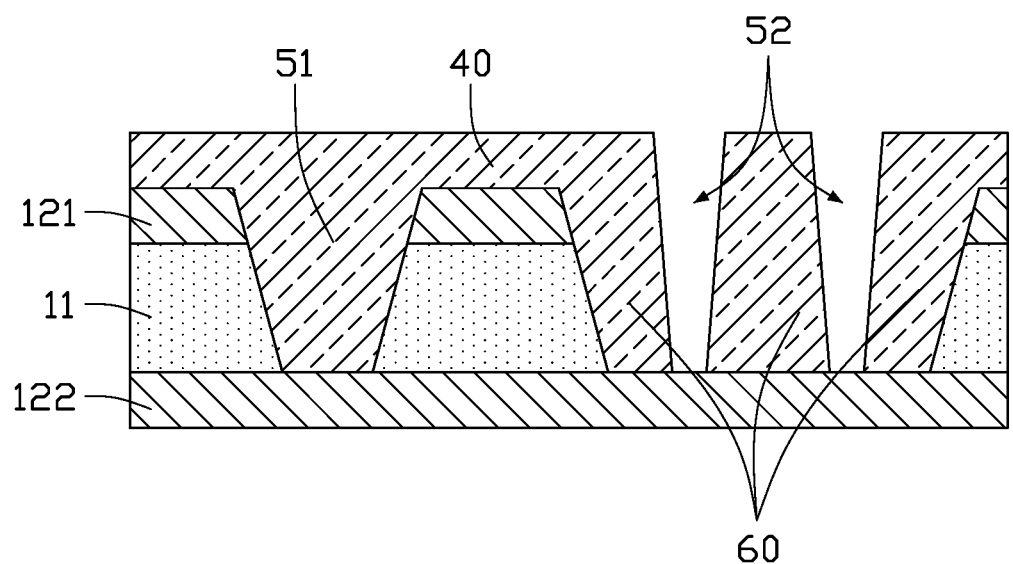
FIG. 5 is an isometric view of opening a second groove on the substrate to form a base plate.
Figure 6:
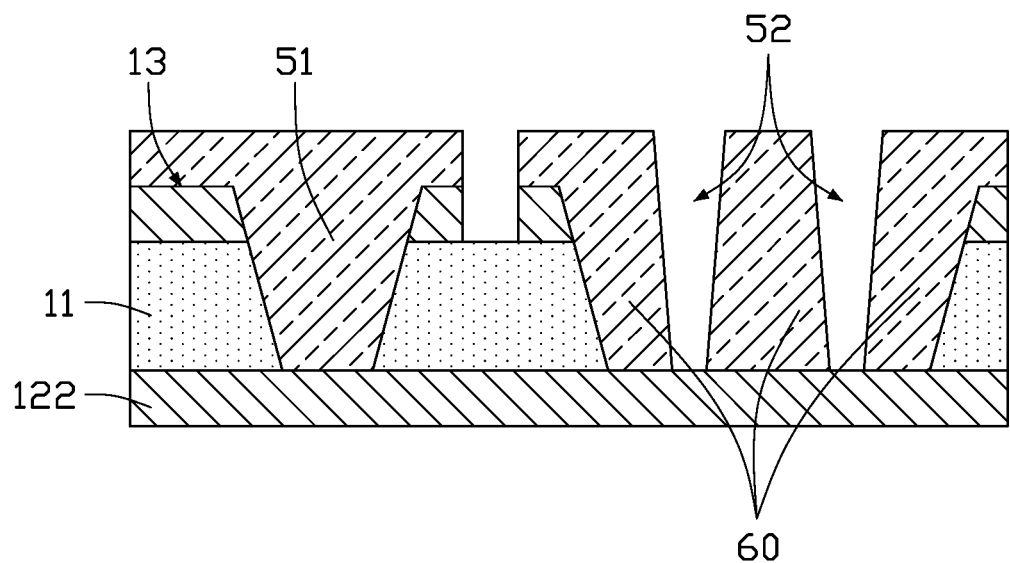
FIG. 6 is an isometric view of a first semi-finished protect.
Figure 7:
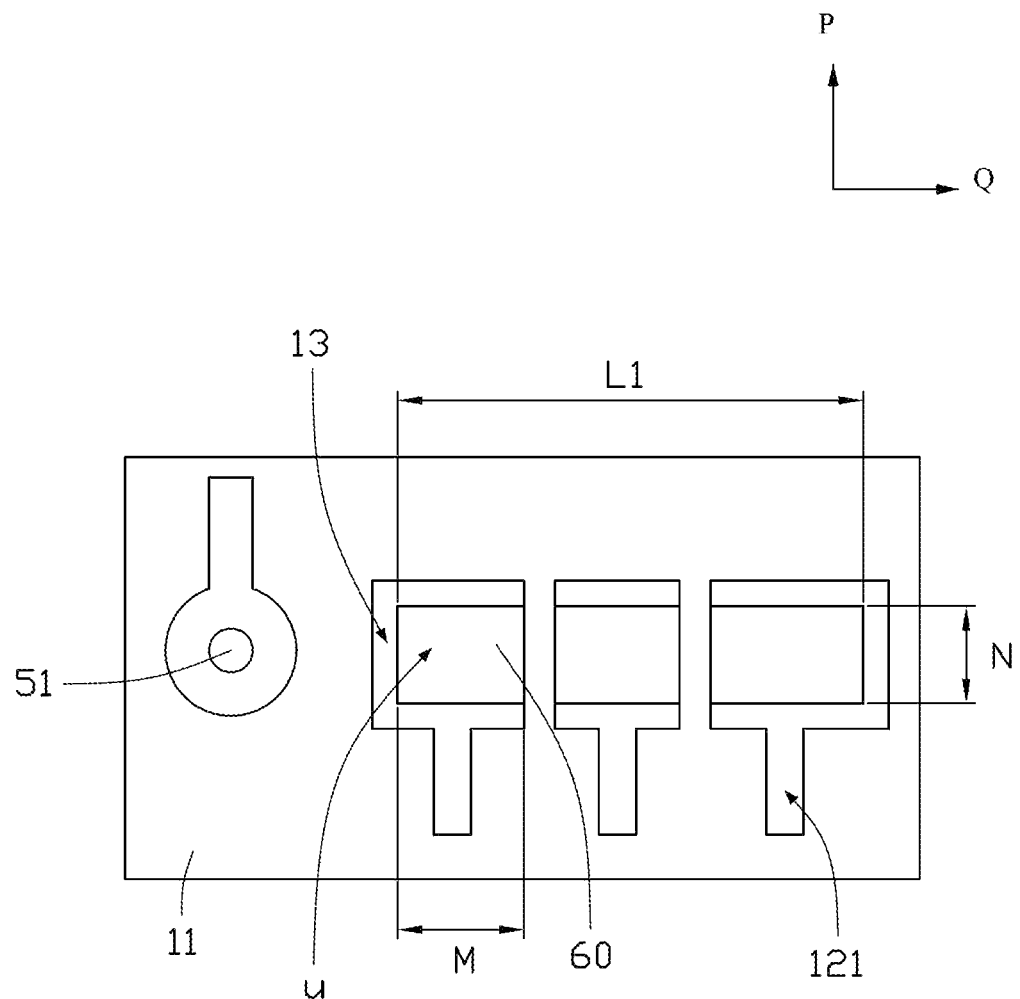
FIG. 7 is a top view of FIG. 6.

S4: referring to FIGS. 5~7, at least one second hole 52 is opened and throughout of the first electroplated coating 40 and the first connecting portion 50. Thus, the first connecting portion 50 and the first electroplated coating 40 corresponding to the first connecting portion 50 are divided into a plurality of second connecting pins 60. The second copper coating 122 is exposed from the second hole 52. The plurality of second connecting pins are used to as input or output end to couple with other electronic component. Thus, a circuit board 70 is manufactured completely.

In this embodiment, a projection of ends of the second connecting pins away from the second copper coating 122 is marked as U. The projection U is rectangular. A length of the projection U is 180~280 μm. A width of the projection U is 15~275 μm. The first substrate 10 has a first direction P and a second direction Q perpendicularly to the first direction P. The aspect ratio of the second connecting pins along the first direction P is defined as D3/M, D3=8~250 μm, M=180~280 μm, D3/M=0.03~1.40. In preferably embodiment, D3=112 μm, M=187.5 μm, D3/M=0.60. The aspect ratio of the second connecting pins along a second direction Q is defined as D3/N, D3=8~250 μm, N=15~275 μm, D3/N=0.03~16.7. In preferably embodiment, D3=112 μm, N=100 μm, D3/N=1.12.

In this embodiment, materials of the first electroplated coating 40 and the first connecting portion 50 are copper. Thus, manufacturing the second hole 52 is become more easier, and a high aspect ratio of the second connecting pins 60 is become more easier.

In this embodiment, from S2 to S4 further including following steps:

S20: referring to FIG. 2, opening at least one third hole 23 on the first substrate 10. The auxiliary metal coating also formed on sides of the hole 23. The third hole 23 is throughout of the first copper coating 121 and the first base layer 11. The second copper coating 122 is exposed from the third hole 23. A cross-section the third hole along the first direction P is trapezoid. The third hole 23 has a third end 24 and a fourth end 25 relative to the third end 24. A projection of the third end 24 and a projection of the fourth end 25 along the first direction P are circular. A diameter of the third end 24 is marked as R1, a diameter of the fourth end 25 is marked as R2, R1>R2. R1=60~120 μm, R2=30~50 μm. A depth of the third hole 23 marked as D4, a depth of the first hole 20 is marked as D3, D3=D4=D1+D2.

S30: referring to FIG. 5, the first electroplated coating 40 is further formed on the first copper coating 121 and the auxiliary metal coating. The first electroplated coating 40 is also filled into the third hole 23 to form a third connecting pin 51. The third connecting pin 51 is used to as input or output end to couple with other electronic component. In this embodiment, the aspect ratio of the third connecting pin 51 is D4/R1, D4=112 μm, R1=100 μm, D4/R1=1.12.

Referring to FIG. 6, the step S4 further includes:

Etching the first copper coating 121 and a portion of the first electroplated coating 40 correspondingly to the first copper coating 121 to form an inner line layer 13. A portion of the first base layer 11 is exposed from the inner line layer 13 to gain a first semi-finished protect 71.

In the method of manufacturing the circuit board 70 of the present disclosure, the second connecting pins have smooth outer surface to improve the stability of signal transmission and heat dissipation efficiency thereof. Further, by opening the holes to form the third connecting pin 51 can improve production efficiency.

Figure 8:
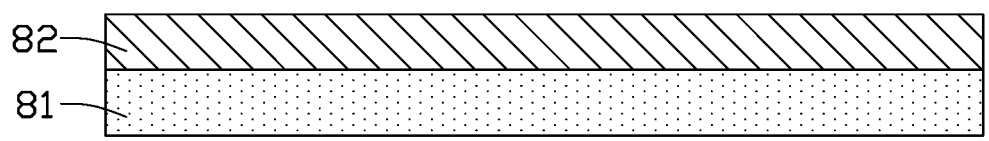
FIG. 8 is an isometric view of a second substrate covered with copper on one side thereof.

Referring to FIGS. 8-11, the present disclosure is described in relation to a method of manufacturing another circuit board. The method of manufacturing the circuit board including following steps:

S1: referring to FIG. 8, providing a second substrate 80, the second substrate 80 includes a second base layer 81 and a third copper coating 82 formed on a side of the second base layer 81.

Figure 9:
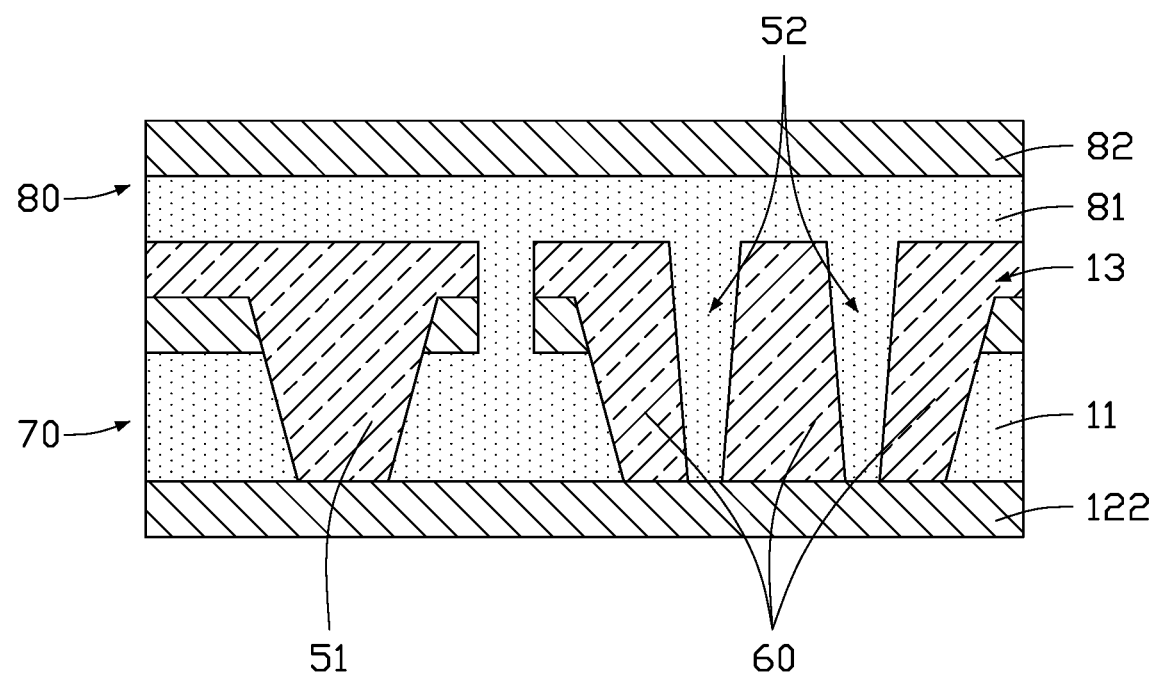
FIG. 9 is an isometric view of combining the semi-finished protect of the circuit board and the second substrate to form a second semi-finished protect.

S2: referring to FIG. 9, bonding the second substrate 80 on the first semi-finished protect 71. The second base layer 81 is toward to the inner line layer 13 and further filled into the second hole 52.

Figure 10:
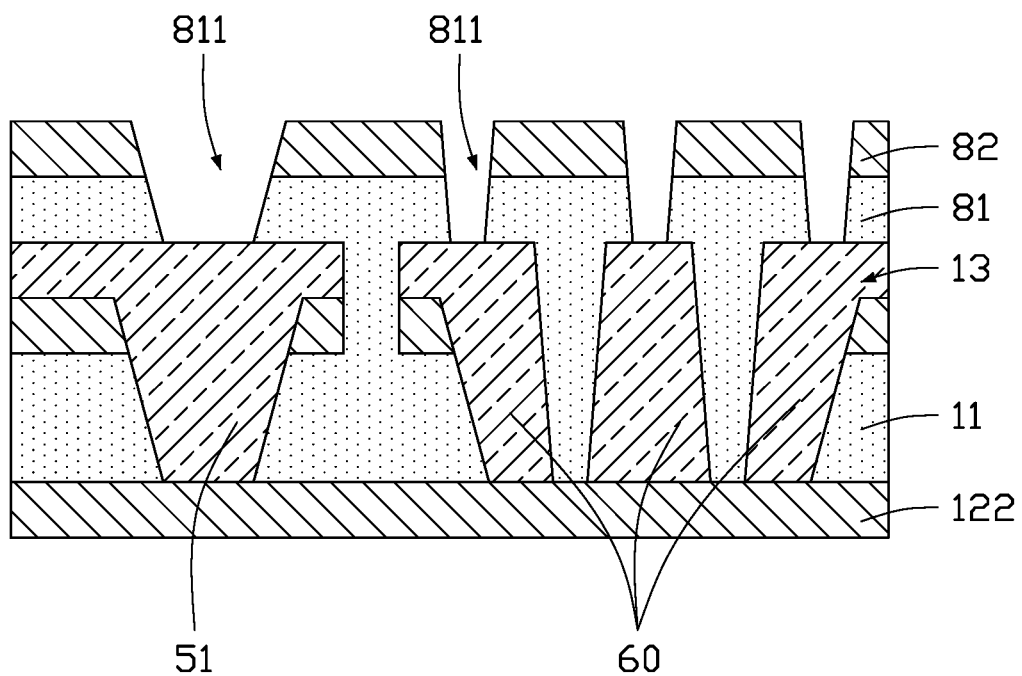
FIG. 10 is an isometric view of opening a third groove on the semi-finished protect of FIG. 9 to form a third semi-finished protect.

S3: referring to FIG. 10, opening a plurality of fourth holes 811 on the second substrate 80. The plurality of fourth holes 811 are throughout of the second substrate 80. The second connecting pins 60 are exposed from the plurality of fourth holes 811.

Figure 11:
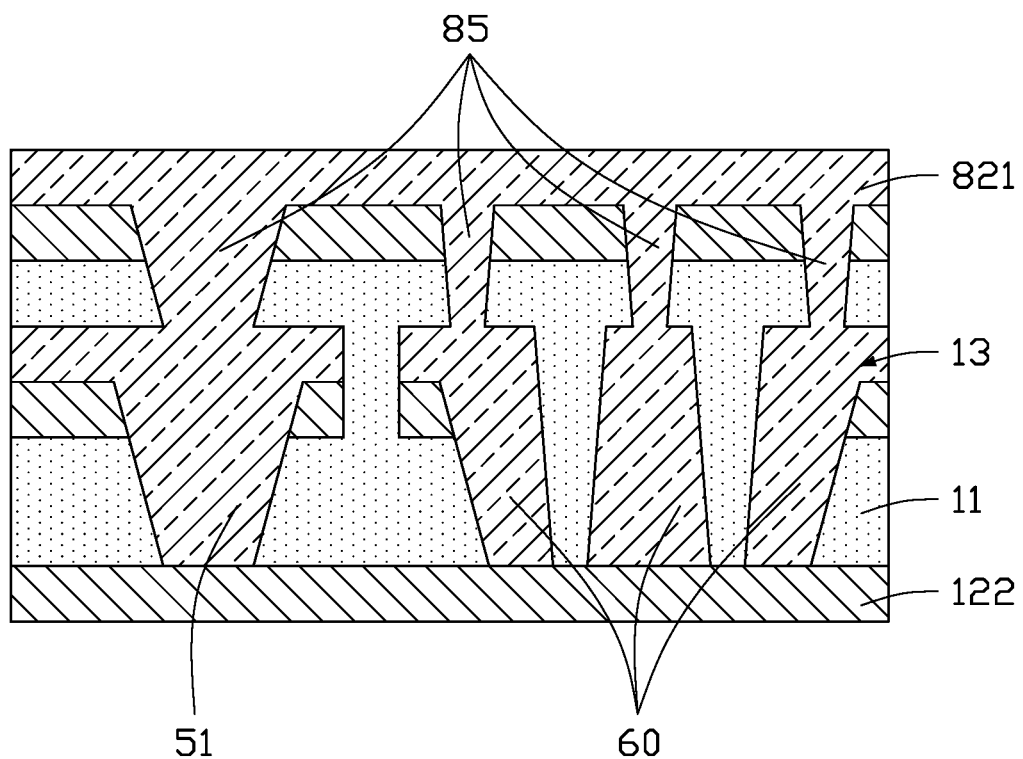
FIG. 11 is an isometric view of forming a second electroplated coating on the third semi-finished protect.

S4: referring to FIG. 11, forming a second electroplated coating 821 on the third copper coating 82. The second electroplated coating 821 is filled into the plurality of fourth holes 811 to form at least one fourth connecting pin 85. The fourth connecting pin 85 electrically connects to the second connecting pins 60. In this embodiment, the third connecting pin 51 is exposed from the fourth hole 811. The fourth connecting pin 85 also electrically connects to the third connecting pin 51.

Figure 12:
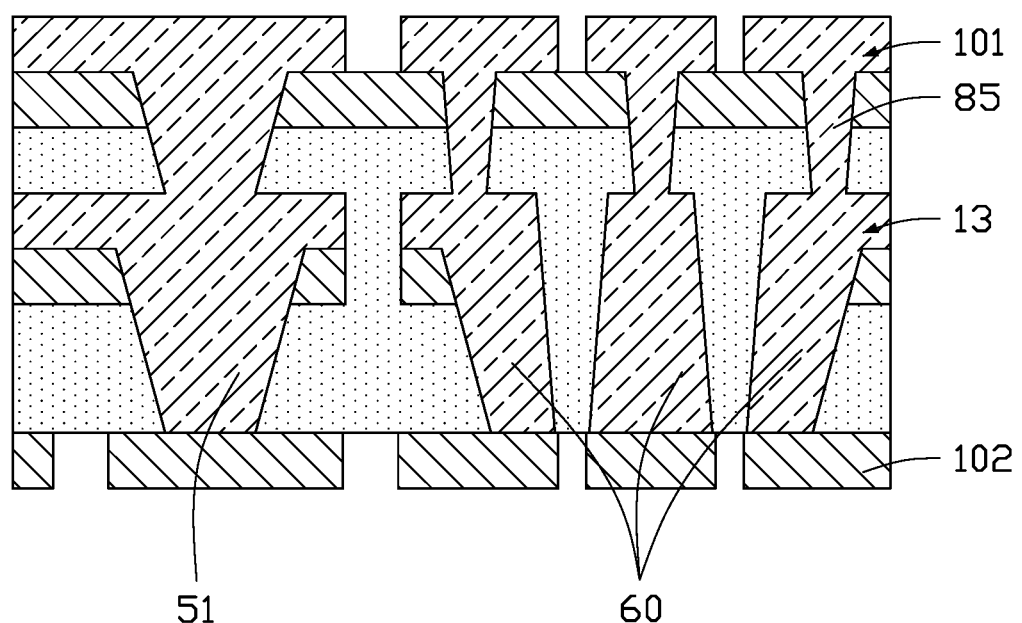
FIG. 12 is an isometric view of the circuit board of the present disclosure.

S5: referring to FIG. 12, etching the second electroplated coating 821 and the third copper coating 82 to gain a first outer line layer 101, and etching a second copper coating 122 to gain a second outer line layer 102, thus the circuit board 100 is manufactured completely.

In at least one embodiment, before forming a second electroplated coating 821, the method of the circuit board may further include forming a seed layer on side walls surrounding to form the fourth holes 811. The seed layer electrically connects to the inner line layer 13 and the third copper coating 82

Referring to FIG. 12, the present disclosure is described in relation to the circuit board 100. The circuit board 100 includes the first outer line layer 101, the second base layer 81, the inner line 13, a first base layer 11 and a second outer line layer 102 arranged from top to bottom. The first hole 20 is formed on the first outer line layer 101 and the first base layer 11. The first connecting portion 50 is formed within the first hole 20. The first connecting portion 50 includes a plurality of second connecting pins 60 electrically connected to the second outer line layer 102 and the inner line layer 13. The plurality of second connecting pins 60 define at least one second hole 52. At least one fourth connecting pin 85 is formed between the first outer line layer 101 and the inner line layer 13. The fourth pin 85 connects to the second connecting pins 60. The second base layer 81 is filled into the inner line layer 13 and the second hole 52.

The embodiments shown and described above are only examples. Many details are often found in the art such as the other features of a method of manufacturing the base plate and the circuit board. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A method of manufacturing a base plate comprising:
providing a first substrate, the first substrate comprising a first base layer, a first copper coating, and a second copper coating covered on two sides of the first base layer;
opening at least one first hole on the first substrate, the first hole penetrating the first base layer and the first copper coating;
forming a first electroplated coating on the first copper coating, the first electroplated coating filling into the first hole to form a first connecting portion; and
opening at least one second hole on the first connecting portion and the first electroplated coating to form a plurality of second connecting pins.

2. The method of manufacturing a base plate of claim 1, wherein further comprising:
opening at least one third hole on the first substrate, the third hole penetrating the first copper coating and the first base layer, the first electroplated coating filling into the third hole to form a third connecting pin.

3. The method of manufacturing a base plate of claim 1, further comprising:
etching the first copper coating and a portion of the first electroplated coating corresponding to the first copper coating to form an inner line layer, a portion of the first base layer exposing from the inner line layer.

4. The method of manufacturing a base plate of claim 1, wherein a cross-section of the first hole along the first direction is trapezoidal, the first hole has a first end and a second end relative to the first end, a length of the first end on the cross-section of the first hole is larger than a length of the second end on the cross-section of the first hole.

5. The method of manufacturing a base plate of claim 1, wherein a projection of ends of the plurality of second connecting pins away from the second copper coating are rectangular, a length of the projection is in a range of 180 µm to 280 µm, a width of the projection is in a range of 15 µm to 275 µm, a depth of the plurality of second connecting pins is in a range of 8 µm to 250 µm.

6. The method of manufacturing a base plate of claim 1, wherein the first substrate comprises a first direction defined along a length direction of the first substrate and a second direction along a width direction of the first substrate, the second direction is perpendicular to the first direction.

7. The method of manufacturing a base plate of claim 6, wherein the aspect ratio of the plurality of second connecting pins along the first direction is in a range of 0.03 to 1.40, and the aspect ratio of the plurality of second connecting pins along the second direction is in a range of 0.03 to 16.7.

8. The method of manufacturing a base plate of claim 1, wherein opening the first hole is by laser or machine drilling.

9. A method of manufacturing a circuit board, comprising:
providing a second substrate comprising a second base layer and a third copper coating formed on a side of the second base layer;
providing a semi-finished protect, a method of manufacturing the semi-finished protect comprising:
providing a first substrate, the first substrate comprising a first base layer, a first copper coating and a second copper coating covered on two sides of the first base layer;
opening at least one first hole on the first substrate, the first hole penetrating the first base layer and the first copper;
forming a first electroplated coating on the first copper coating, the first electroplated coating filling into the first hole to form a first connecting portion;
opening at least one second hole on the first connecting portion and the first electroplated coating to form a plurality of second connecting pins; and
etching the first copper coating and a portion of the first electroplated coating correspondingly to the first copper coating to form an inner line layer to gain a first semi-finished protect;
bonding the second substrate on the first semi-finished protect, the second base layer being toward to the inner layer and filled into the second hole;
opening a plurality of fourth holes on the second substrate, the plurality of holes penetrating the second substrate, the plurality of second connecting pins been exposed from the plurality of fourth holes;
forming a second electroplated coating on the third copper coating;
etching the second electroplated coating and the third copper coating to gain a first outer line layer, and further etching a second copper coating to gain a second outer line layer.

10. The method of manufacturing a circuit board of claim 9, wherein a portion of the first base layer is exposed from the inner layer.

11. The method of manufacturing a circuit board of claim 9, wherein the second electroplated coating filling into the plurality of fourth holes to form at least one fourth connecting pin, the fourth connecting pin connecting to one of the plurality of second connecting pins.

12. The method of manufacturing a circuit board of claim 9, further comprising:
opening at least one third hole on the first substrate, the third hole penetrating the first copper coating and the first base layer, the first electroplated coating filling into the third hole to form a third connecting pin.

13. The method of manufacturing a circuit board of claim 9, further comprising:
etching the first copper coating and a portion of the first electroplated coating corresponding to the first copper coating to form an inner line layer, a portion of the first base layer exposing from the inner line layer.

14. The method of manufacturing a circuit board of claim 9, wherein a cross-section of the first hole along the first direction is trapezoidal, the first hole has a first end and a second end relative to the first end, a length of the first end on the cross-section of the first hole is larger than a length of the second end on the cross-section of the first hole.

15. The method of manufacturing a circuit board of claim 9, wherein a projection of ends of the plurality of second connecting pins away from the second copper coating are rectangular, a length of the projection is in a range of 180 µm to 280 µm, a width of the projection is in a range of 15 µm to 275 µm, a depth of the plurality of second connecting pins is in a range of 8 µm to 250 µm.

16. The method of manufacturing a circuit board of claim 9, wherein the first substrate comprises a first direction defined along a length direction of the first substrate and a second direction along a width direction of the first substrate, the second direction is perpendicular to the first direction.

17. The method of manufacturing a circuit board of claim 9, wherein the aspect ratio of the plurality of second connecting pins along the first direction is in a range of 0.03 to 1.40, and the aspect ratio of the plurality of second connecting pins along the second direction is in a range of 0.03 to 16.7.

18. The method of manufacturing a circuit board of claim 9, wherein opening the first hole is by laser or machine drilling.

* * * * *